(12) United States Patent
Mbouombouo

(10) Patent No.: US 6,718,524 B1
(45) Date of Patent: Apr. 6, 2004

(54) METHOD AND APPARATUS FOR ESTIMATING STATE-DEPENDENT GATE LEAKAGE IN AN INTEGRATED CIRCUIT

(75) Inventor: Benjamin Mbouombouo, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 45 days.

(21) Appl. No.: 09/953,667

(22) Filed: Sep. 17, 2001

(51) Int. Cl.[7] .......................... G06F 17/50; G06F 9/00; G06F 11/00; G01R 31/28
(52) U.S. Cl. .......................... 716/4; 716/2; 324/765; 709/105; 714/735
(58) Field of Search .......................... 716/4; 324/765; 709/105; 714/735

(56) References Cited

U.S. PATENT DOCUMENTS

| | | | | |
|---|---|---|---|---|
| 5,692,160 A | * | 11/1997 | Sarin | 703/23 |
| 5,838,947 A | * | 11/1998 | Sarin | 703/14 |
| 6,239,607 B1 | * | 5/2001 | Maxwell et al. | 324/765 |
| 6,493,856 B2 | * | 12/2002 | Usami et al. | 716/10 |
| 6,515,500 B1 | * | 2/2003 | Okuda | 324/765 |

2002/0116440 A1 * 8/2002 Cohn et al. ................. 709/105

OTHER PUBLICATIONS

F. Hamzaoglu et al., Circuit–Level Techniques to Control Gate leakage for sub–100nm CMOS, Proceedings of the 2002 International Symposium on Low Power Electronics and Design, pp. 60–62, Aug. 2002.*
P.C. Maxwell et al., Estimation of Defect–Free IDDQ in Submicron Circuits Using Switch Level Simulation, Proceedings of International Test Conference, pp. 18–23, Oct. 1998.*
A. Ferre et al., IDDQ Characterization in Submicron CMOS, International Test Conference, pp. 136–145, Nov. 1997.*
A. Ferre et al., LEAP: An Accurate Defect–free IDDQ Estimator, IEEE European Test Workshop, pp. 33–38, May 2000.*

* cited by examiner

*Primary Examiner*—A. M. Thompsons
(74) *Attorney, Agent, or Firm*—Westman Champlin & Kelly

(57) ABSTRACT

A method and apparatus are provided for estimating gate leakage of an integrated circuit design having a plurality of transistors. The method and apparatus simulate an operating state of the integrated circuit design and estimate the gate leakage as a function of the states of the transistors in response to the simulated operating state.

18 Claims, 3 Drawing Sheets

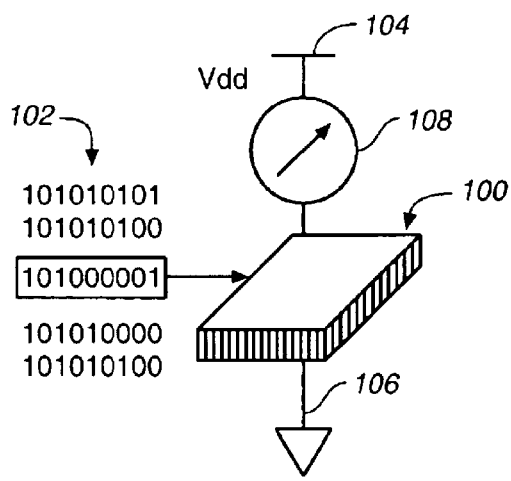
FIG._1
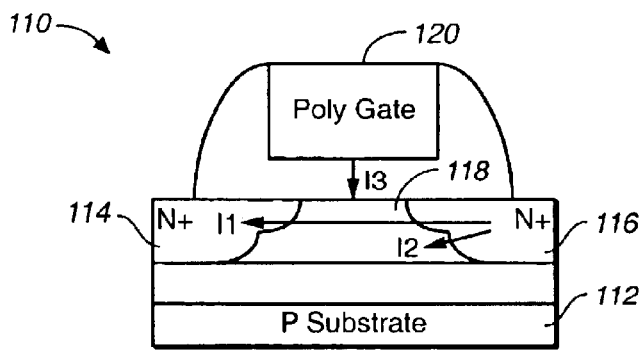
FIG._2
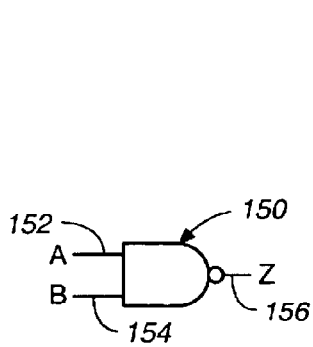
FIG._3
(PRIOR ART)
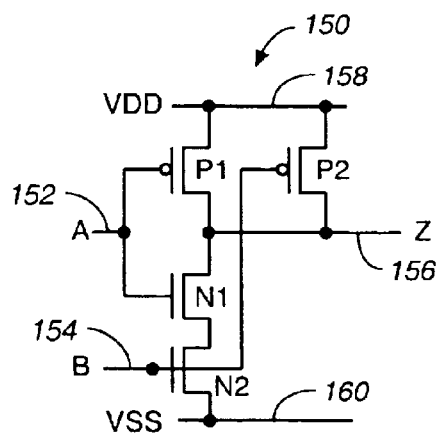
FIG._4
(PRIOR ART)

Gate Leakage Look-Up Table for a Cell with 2 Inputs (2-inputs NAND Gate)

| State of Inputs | | State of Transistors in "ON" State | Gate Leakage Calculation |
|---|---|---|---|
| A | B | | |
| 1 | 1 | N1,N2 | (N1_area + N2_area) * NMOS_gate_Leakage_per_unit_area |
| 1 | 0 | N1,P2 | (N1_area * NMOS_gate_Leakage_per_unit_area) + P2_area * PMOS_gate_Leakage_per_unit_area |
| 0 | 1 | P1,N2 | (N2_area * NMOS_gate_Leakage_per_unit_area) + P1_area * PMOS_gate_Leakage_per_unit_area |
| 0 | 0 | P1,P2 | (P1_area + P2_area) * PMOS_gate_Leakage_per_unit_area |

Channel Leakage Look-Up Table for a Cell with 2 Inputs (2-inputs NAND Gate)

| State of Inputs | | Simulated Channel Leakage (via Hspice) |
|---|---|---|
| A | B | |
| 1 | 1 | channel_leakage_<cell_name>_11 |
| 1 | 0 | channel_leakage_<cell_name>_10 |
| 0 | 1 | channel_leakage_<cell_name>_01 |
| 0 | 0 | channel_leakage_<cell_name>_00 |

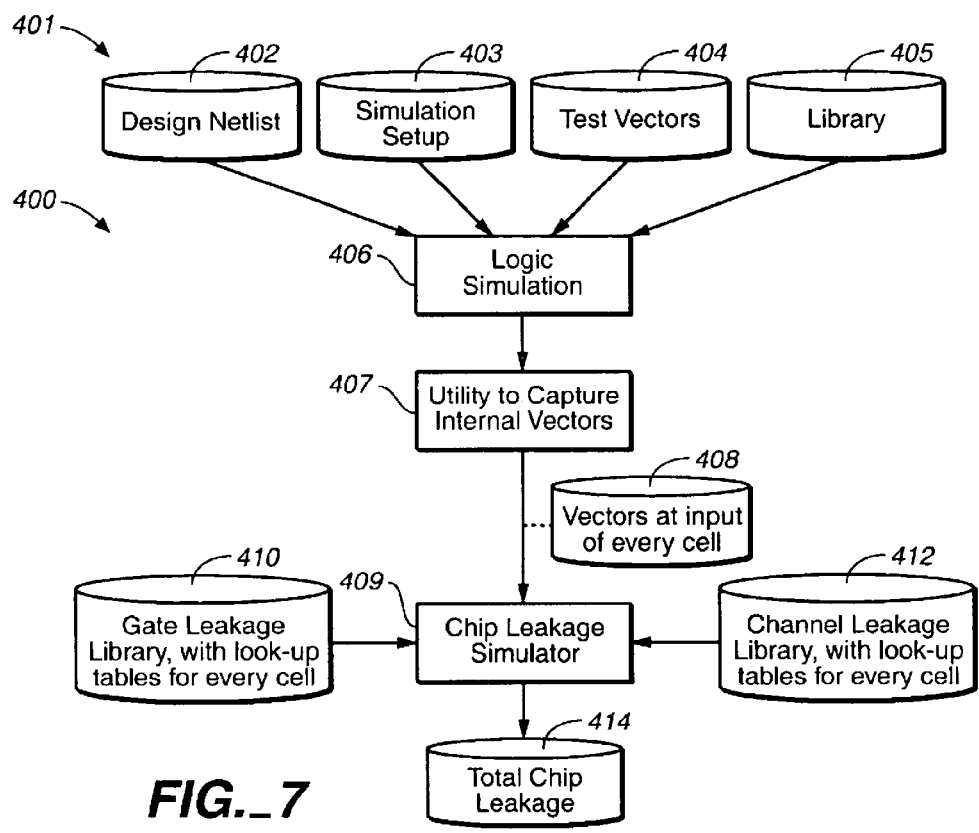
FIG._7

METHOD AND APPARATUS FOR ESTIMATING STATE-DEPENDENT GATE LEAKAGE IN AN INTEGRATED CIRCUIT

FIELD OF THE INVENTION

The present invention relates to the design and testing of semiconductor integrated circuits for potential fabrication faults. More specifically, the present invention relates to a method and apparatus of estimating state-dependent gate leakage.

BACKGROUND OF THE INVENTION

Following fabrication, semiconductor integrated circuits such as complimentary metal-oxide semiconductor (CMOS) circuits are tested for a variety of potential fabrication faults. One type of test is known as "static current testing". Static current testing is based on an assumption that a fault-free CMOS circuit draws very little supply current in a steady state. This current is known as "leakage" current. Certain manufacturing faults on an integrated circuit cause unwanted shorts within the devices fabricated on the integrated circuits. Under certain test conditions, these shorts can cause an increase in the current drawn by the integrated circuit. A faulty integrated circuit often draws current that is several orders of magnitude greater than that drawn by a non-faulty integrated circuit. Therefore, the leakage current drawn by an integrated circuit under certain test conditions can be used to indicate the presence of a manufacturing defect in the circuit.

Static current testing is performed by applying test vectors to the integrated circuit and making one or more current measurements during a quiescent state of the circuit. A test vector is typically applied to the circuit by serially shifting the test vector into the circuit through a chain of "scannable" elements and then clocking the circuit. The test vectors that are used for static current testing contain vectors that will put the circuit into a low drain current ($I_{DD}$) state. Static current testing is often referred to as $I_{DDQ}$ testing.

Once the circuit is in the desired state, the circuit is "strobed" near the end of a clock cycle. That is, a snapshot of the circuit is taken, and the status of selected pins and nets is recorded along with the stability of the circuit. The strobe point for each test vector is usually the last time unit in the clock cycle. If the state of the circuit at a particular strobe point is such that a defect-free chip in that state would not draw supply current, then the test vector and the resulting test patterns obtained at that strobe point can be successfully used for $I_{DDQ}$ testing.

There are several contributors to leakage current that is drawn when the circuit is in a low-current drawing state. These contributors include sub-threshold (device-off) leakage, thermal and tunneling junction leakage, and gate-or-oxide leakage. Previously, gate or oxide leakage was largely ignored since it accounted for only a small amount of the total leakage current. Also, Gate leakage was difficult to estimate since it is state-dependent. Gate leakage flows only when a device is "ON". If a device is "OFF" then the gate leakage is zero. Without knowing the state of each transistor in a design, an accurate gate leakage estimate for a design is not possible.

With low leakage devices, such as wireless and hand-held devices, gate leakage is becoming a greater factor in the total leakage current within the device. For example, gate leakage can account for about 25% of the total leakage current in a low-leakage device. Therefore, gate or oxide leakage can no longer be ignored as it has in the past. However, conventional simulation tools in the market today are not capable of accurately simulating gate leakage. Although some conventional tools are capable of estimating total possible NMOS and PMOS gate leakage, they are not capable of taking into account the state-dependency of these leakage's. Therefore, conventional tools are not accurate and cannot be used as a means for generating an estimate that can be used for screening defective parts due to high gate leakage.

Improved methods and apparatus for estimating gate leakage are desired.

SUMMARY OF THE INVENTION

One embodiment of the present invention is directed to a method of estimating gate leakage of an integrated circuit design having a plurality of transistors. The method includes simulating an operating state of the integrated circuit design and estimating the gate leakage as a function of the states of the transistors in response to the simulated operating state.

Another embodiment of the present invention is directed to a method of estimating gate leakage of an integrated circuit design having at least one element. The method includes simulating an operating state of the integrated circuit design, identifying logic states at inputs to the element in response to the operating state, and producing a gate leakage estimate based on the logic states at the inputs to the element.

Yet another embodiment of the present invention is directed to an integrated circuit technology library. The library includes a cell library definition for each of a plurality of elements in the library. Each cell library definition includes a list of inputs to the element, a list of each transistor in the element, a gate area for each of the transistors in the element, a gate leakage per unit area for each of the transistors in the element, and a gate leakage estimate for each combination of logic states at the inputs to the element. The gate leakage estimate is based on the gate area and the gate leakage per unit area of each of the transistors in the element that are in an ON state for that combination of logic states.

BRIEF DESCRIPTION OF THE DRAWINGS

FIG. 1 is a simplified, schematic diagram illustrating static current testing of an integrated circuit according to one embodiment of the present invention.

FIG. 2 is a schematic illustration of leakage components in an N-Type Metal Oxide Semiconductor (NMOS) device.

FIG. 3 illustrates a logic symbol of a two-input NAND gate.

FIG. 4 is a schematic diagram of the two-input NAND gate shown in FIG. 3.

FIG. 5 illustrates a gate leakage look-up table for the two-input NAND gate shown in FIGS. 3 and 4.

FIG. 6 illustrates a channel leakage look-up table for the two-input NAND gate shown in FIGS. 3 and 4.

FIG. 7 is a flow chart illustrating a method of estimating leakage current for an integrated circuit design according to one embodiment of the present invention.

DETAILED DESCRIPTION OF ILLUSTRATIVE EMBODIMENTS

FIG. 1 is a simplified, schematic diagram illustrating static current testing of an integrated circuit 100 according to one embodiment of the present invention. Static current testing is performed by applying test vectors 102 to integrated circuit 100 and making one or more current measurements during a quiescent or steady state of the circuit. Static current testing can be applied at a wafer level, a packaged device level, during incoming inspection, during lifetime tests, or during on-line testing.

Integrated circuit 100 is electrically coupled to a text fixture (not shown) which supplies power to the integrated circuit through voltage supply terminals 104 and 106. The test fixture also sets selected inputs to the circuit to a known state and supplies the test vectors 102 for performing the test. A current sensor 108 is coupled in series between voltage supply terminal 104 and one of the power supply pads of integrated circuit 100 for measuring the resulting current drawn by integrated circuit 100.

In one embodiment, each test vector 102 is applied to circuit 100 by serially shifting the test vector into the circuit through a chain of "scannable" elements and then clocking the circuit through its clock input pins. The scannable elements are formed in integrated circuit 100 by including extra logic and a multiplexer to selected sequential elements in the circuit. Each scannable element selects data from a normal data input or a test data input based on a test enable signal provided to integrated circuit 100. The scannable elements are connected together in series to form a scan chain by connecting the output of each scannable element to the test data input of the next, subsequent scannable element in the chain.

When the test enable input to the circuit is activated, the scannable elements switch from the normal data flow mode to the scan mode. Each scannable element is controlled to select data from the test data input as opposed to the normal data input. One of the test vectors 102 is then loaded into the scannable elements by serially shifting the test vector through the scan chain. After the test vector is loaded, the test enable input is deactivated and the scannable elements switch from the scan mode the normal data flow mode. The circuit is then clocked, and current sensor 108 measures the current drawn by circuit 100 after the circuit has returned to a steady state.

The test vectors that are used for static current testing are selected to put circuit 100 into a state such that all sources of DC current in circuit 100 are shut off and the circuit draws little or no drain current through its transistors. The remaining current that is drawn by integrated circuit 100 is known as "leakage" current. Once circuit 100 is in a steady state following application of an individual test vector 102 to the circuit, the DC current drawn through power supply terminals 104 and 106 is measured. If the current exceeds a specified tolerance, there may be a short or some other fault condition in integrated circuit 100. Such a fault can cause a functional failure in the circuit or may have an adverse effect on the lifetime and reliability of the circuit.

FIG. 2 schematically illustrates leakage current components in a N-type metal oxide semiconductor (NMOS) device. Device 110 includes a P-type substrate 112, N-type source and drain regions 114 and 116, a channel 118 and a gate 120. Leakage current through device 110 has two main parts. The first part includes sub-threshold (device-off) leakage I1 and thermal and tunneling junction leakage I2. Sub-threshold leakage I1 and thermal and tunneling junction leakage I2 currently can be simulated for each device in an integrated circuit design through known software programs, such as Hspice.

The second leakage component includes gate or oxide leakage I3. Gate leakage I3 is state-dependent. Gate leakage I3 is zero if device 110 is in an "OFF" state (no drain current). If device 110 is in an "ON" state, gate leakage I3 is a function of the area (length times width) of gate 120 and the gate leakage per unit area for device 110, which would be a function of the oxide thickness. With low leakage integrated circuit designs, such as those used for wireless and hand-held applications, gate leakage I3 can account for about 25% of the total leakage in the design. Therefore, it is becoming more important to have the ability to simulate accurately the gate leakage of a particular design in order to provide an accurate leakage estimate and to derive a threshold leakage value that can be used to screen parts for fabrication faults.

According to one embodiment of the present invention, the total gate leakage of an integrated circuit design is accurately estimated for a particular test vector by determining which transistor devices in the integrated circuit are driven to the "ON" state in response to the test vector and then calculating the respective gate leakages for each of these transistors based on leakage characteristics that are added to the technology library. The respective gate leakages are then summed to produce a total gate leakage estimate for the entire design. This can also be added to other estimated leakage currents, such as I1 and I2, to produce an overall leakage value.

With this methodology, the overall leakage of an integrated circuit design can be simulated and then compared to the actual leakage measured on silicon. This can be used to make sure that any leakage limit that is set for a particular integrated circuit design can be correlated with the simulated leakage. Without the simulated leakage current, the leakage limit set for a particular integrated circuit design may be inaccurate, resulting in non-defective chips being thrown away or defective chips being qualified as non-defective. Also, the overall leakage current estimate can be given directly to the customer as an expected leakage for their design, for example to determine the battery lifetime in stand-by-mode for devices.

A typical integrated circuit design includes one or more instances of a variety of elements (or "cells"). Typical cells include, among others, random logic cells, memory cells, mixed signal cells and analog cells. Each cell in the technology library is defined by a cell library definition. Each cell library definition includes cell layout definitions and cell characteristics. The cell layout definitions include a layout pattern of the transistors in the cell, geometry data for the cell's transistors, cell routing data and information regarding the cell's inputs and outputs. The cell characteristics include a cell propagation delay and a model of the cell's function.

The cell parameters or characteristics needed to estimate the gate leakage of each cell can be added to each of the respective cell library definitions in the technology library or as a gate leakage database, which includes the gate leakage parameters for all cells and is included along with the cell definitions in the technology library. These parameters include the gate area of each transistor in the cell, the gate leakage per unit area of each transistor type (such as NMOS and PMOS devices), which can be a function of oxide thickness if a particular cell type is available with different oxide thicknesses, and the dependency of the gate leakage on the state of each transistor in the cell.

For each cell instance used in a design, the state of each NMOS or PMOS device in that cell can be determined based on the logic states of the signals at the inputs to the cell. The gate leakage for each cell instance can then be determined by multiplying the area of each transistor in the cell that is in an "ON" state by the gate leakage per unit area of that transistor and then summing the individual gate leakages. The total gate leakage of the design can then be calculated by summing the gate leakages of all cells in the design.

The state-dependency of the gate leakage for a typical two-input logic NAND gate is shown in an example with respect to FIGS. 3–5. FIG. 3 shows the logic symbol of a two-input logic NAND gate (or cell) 150. Cell 150 has inputs 152 and 154 (labeled "A" and "B", respectively) and an output 156 (labeled "Z").

FIG. 4 is a schematic diagram of cell 150, as defined in the cell layout definition provided in the technology library. Cell 150 includes NMOS transistors N1 and N2 and PMOS transistors P1 and P2, which are coupled together to perform a logic NAND function between inputs and 152 and 154 and output 156. Cell 150 further includes power supply terminals 158 and 160 (labeled "VDD" and "VSS") for coupling to respective power supply buses within the integrated circuit design.

As mentioned above, gate leakage flows through a transistor only when the transistor is "on". If the transistor is "off", then the gate leakage for that transistor is zero. Therefore, cell 150 has a gate leakage that is dependent on the logic states of the signals applied to inputs 152 and 154. For example, if inputs 152 and 154 are both "low", transistors N1 and N2 will be "off" and transistors P1 and P2 will be "on". In this state, the gate leakage for cell 150 will be the gate leakage through transistor P1 plus the gate leakage through transistor P2. In contrast, if inputs 152 and 154 are both "high", transistors N1 and N2 will be "on" and transistors P1 and P2 will be "off". In this state, the gate leakage for cell 150 will be the gate leakage through transistor N1 plus the gate leakage through transistor N2.

Thus, for each cell in the technology library, the gate leakage for that cell can be modeled by capturing the "on" and "off" states of the internal NMOS and PMOS devices as a function of the input combinations applied to that cell. These gate leakage parameters can then be provided in technology library in the form of a look-up table, which provides an appropriate gate leakage estimate for each combination of input states.

FIG. 5 is an example of a gate leakage look-up table for the two-input NAND gate shown in FIGS. 3 and 4. Table 200 includes, for each combination of inputs "A" an "B", a list of the transistors in the "on" state and the corresponding gate leakage calculation (or resulting value). For the input combination "11", transistors N1 and N2 are in the on state, and transistors P1 and P2 are in the off state. Therefore, cell 150 (shown in FIGS. 3 and 4) will draw gate leakage current through only transistors N1 and N2. The gate leakage for this combination of input states is:

(N1_area+N2_area)*NMOS_gate_leakage_per_unit_area where:

N1_area=the gate area of transistor of N1;

N2_area=the gate area of transistor of N2; and

NMOS_gate_leakage_per_unit_area=the gate leakage per unit area of an NMOS transistor.

Table 200 includes similar calculations for the remaining combinations of input logic states. The table shown in FIG. 5 is simplified to assume a single oxide thickness for illustration purposes. However, different value of gate leakage per unit area can be provided for different oxide thicknesses.

A similar table can be provided for each different type of cell in the technology library. Each table can be included in each respective cell library definition or combined in a larger gate leakage database within the technology library.

In one embodiment, each cell library definition further includes an additional look-up table which provides an estimated channel leakage value for each combination of inputs. The channel leakage value includes sub-threshold leakage (leakage current I1 in FIG. 2) and reverse bias leakage (leakage current I2 in FIG. 2). The channel leakage is pre-simulated for every cell and stored in the respective tables. FIG. 6 illustrates a table 300 which provides the channel leakage for a two-input NAND gate as a function of the vector applied to inputs "A" and "B" of the cell. In one embodiment, for each combination of inputs, the state-dependent channel leakage is simulated with a software program such as Hspice and then stored in table 300.

FIG. 7 is a flow chart illustrating a method 400 of estimating the leakage current of an integrated circuit design, according to one embodiment of the present invention. The steps performed in FIG. 7 can be performed by a single computer-aided design tool or with multiple tools that interact with one another either directly or through suitable output files. At step 401, several input files or databases are received. These input files or databases include a design netlist 402, simulation setup parameters 403, a list of test vectors (such as $I_{DDQ}$ vectors) 404 and a technology library 405. As mentioned above, design netlist 402 includes a list of all cells within the integrated circuit design and the interconnections between the cells. These cells are selected from technology library 405, which is typically provided by the semiconductor manufacturer. The cells in technology library 405 are defined by cell library definitions. Each cell library definition includes a representation of tables 200 (shown in FIG. 5) and 300 (shown in FIG. 6), which are adapted to the particular cell type. Also included in each cell library definition would be the gate areas of each transistor in that cell and the gate leakage per unit area of each transistor type.

Simulation set-up parameters 403 can include various parameters such as: process parameters (e.g., Best Case NMOS and Best Case PMOS); Operating Temperature (e.g., NOMINAL=25° C. and Worst Case=125° C.); Operating Voltage VDD (e.g., NOMINAL VDD and BEST CASE VDD+10%); and Simulation Time. Test vectors 404 include the test vectors that will be applied to the integrated circuit design and are typically provided with a test bench that has been developed for the particular integrated circuit design. This file can also include a list of the nodes in netlist 402 that should be monitored during simulation. This list of nodes can have any suitable file format, such as a Verilog or VHDL file format.

At step 406, a simulation tool simulates the response of a functional model of the integrated circuit, as defined by the netlist 402 and the technology library 405, to the series of test vectors 404. As mentioned above, the simulation tool scans or otherwise loads each test vector into the functional model. The functional model is then "clocked", and the resulting states of the nodes listed in the dump file are recorded at one or more instants in time, at step 407. The simulation tool records the states at the inputs to each cell instance in netlist 402 in the form of a value change dump (VCD) file 408, which can have any suitable file format. The VCD file is then provided to a chip leakage simulator tool, at step 409.

For each cell instance in netlist 402, the chip leakage simulator reads the corresponding gate leakage estimate for that cell instance from gate leakage library 410 provided with technology library 405. As described above with respect to FIG. 5, the corresponding gate leakage estimate for each cell instance is based on the logic states at the inputs to those cells, as defined by vectors 408.

The chip leakage simulator also reads the corresponding channel leakage for each cell instance in netlist 402 from channel leakage library 412. Again, as shown in FIG. 6 the channel leakage values that are read from library 412 (e.g., table 300) are based on the logic states at the inputs to each cell instance as defined by vectors 408. The chip leakage simulator then sums the channel leakages of each cell instance in netlist 402 with the gate leakages of each cell instance to produce a total chip leakage value 414. The result is a state-dependent leakage estimate that accurately reflects the actual gate leakage that would be expected from a non-defective integrated circuit in response to the simulation test vector.

With this methodology, the estimated gate leakage accurately reflects the state-dependency of the gate leakage. The overall leakage of an integrated circuit design can therefore be simulated accurately and then compared to the actual leakage measured on silicon. This can be used to make sure that any leakage limit that is set for a particular integrated circuit design correlates with the simulated leakage.

Although the present invention has been described with reference to preferred embodiments, workers skilled in the art will recognize that changes may be made in form and detail without departing from the spirit and scope of the invention. For example, individual steps shown in the flow chart of FIG. 7 can be implemented in software, hardware, or a combination of both hardware and software. One or more of the steps or elements can be implemented on a computer-readable medium containing instructions which, when executed on a computer, cause the computer to perform the described functions. Also, the tables shown in FIGS. 5 and 6 can be implemented in any suitable manner within the technology library or as a separate file associated with the library. Individual entries within the tables can include fixed values, parameters, equations or other representations for which the leakage current estimates can be derived.

What is claimed is:

1. A method of estimating gate leakage of an integrated circuit design having at least one element, the method comprising:
   (a) simulating an operating state of the integrated circuit design;
   (b) identifying logic states at inputs to the element in response to the operating state simulated in (a); and
   (c) producing a gate leakage estimate based on the logic states at the inputs to the element.

2. The method of claim 1 wherein (a) comprises:
   (a)(1) applying a test vector to a functional model of the integrated circuit design;
   (a)(2) simulating a response of the functional model to the test vector with a computer software simulation program; and
   (a)(3) outputting the logic states at the inputs of the element when the functional model is in a steady state.

3. The method of claim 1 wherein:
   (b) comprises identifying any transistors within the element that are in an ON state in response to the operating state simulated in (a); and
   (c) comprises producing the gate leakage estimate based on a gate area and a gate leakage value per unit area for each of the transistors identified in (b) as being in the ON state.

4. The method of claim 1 and further comprising:
   (d) reading cell characteristics for the element from a technology library, wherein the cell characteristics comprise gate leakage estimates for the element as a function of the logic states at the inputs to the element; and
   (e) producing in (c) a gate leakage estimate for the logic element as a function of the logic states at the inputs to the logic element.

5. The method of claim 4 wherein, in (d), the cell characteristics further comprise a look-up table having, for each combination of the logic states at the inputs to the element, one of the gate leakage estimates for that element based on a gate area and a gate leakage value per unit area for each transistor in the element that is in an ON state in response to that combination of the logic states.

6. The method of claim 5 wherein, in (d), the cell characteristics further comprise a look-up table having, for each combination of the logic states at the inputs to the element, a channel leakage estimate for the element.

7. The method of claim 1 wherein the integrated circuit design comprises a plurality of elements and wherein:
   (b) comprises identifying the logic states at the inputs to each of the plurality of element in response to the operating state simulated in (a); and
   (c) comprises producing a respective gate leakage estimate for each of the plurality of elements based on the logic states at the inputs to that element.

8. The method of claim 7 and further comprising:
   (d) summing the respective gate leakage estimates of the plurality of elements to produce a total gate leakage estimate for the integrated circuit design.

9. The method of claim 8 and further comprising:
   (e) measuring actual gate leakage of an integrated circuit which is fabricated according to the integrated circuit design and is operated in the operating state simulated in (a); and
   (f) identifying whether a potential defect exists in the integrated circuit based on the actual gate leakage measured in (e) and the total gate leakage estimate produced in (d).

10. A method of estimating gate leakage of an integrated circuit design having a plurality of transistors, the method comprising:
    (a) simulating an operating state of the integrated circuit design; and
    (b) estimating the gate leakage as a function of states of the plurality of transistors in the integrated circuit design in response to the operating state simulated in.

11. The method of claim 10 wherein the integrated circuit design comprises a plurality of elements, each element comprising at least one of the plurality of transistors and wherein (a) comprises:
    (a)(1) applying a test vector to a functional model of the integrated circuit design;
    (a)(2) simulating a response of the functional model to the test vector with a computer software simulation program; and
    (a)(3) outputting logic states produced at inputs to each of the elements when the functional model is in a steady state.

12. The method of claim 10 wherein the integrated circuit design comprises a plurality of elements, each element comprising at least one of the plurality of transistors and wherein:

(a) comprises identifying logic states at inputs to each of the plurality of elements in response to the operating state; and (b) comprises producing a respective gate leakage estimate for each of the plurality of elements based on the logic states at the inputs to that element, and summing the respective gate leakage estimates to produce a total gate leakage estimate for the integrated circuit design.

13. The method of claim 12 wherein (b) further comprises, for each of the elements:

(b)(1) identifying any transistors within the element that are in an ON state in response to the operating state simulated in (a); and (b)(2) producing the respective gate leakage estimate based on a gate area and a gate leakage value per unit area for each of the transistors identified in (b)(1) as being in the ON state.

14. The method of claim 12 and further comprising:

(c) reading cell characteristics for each of the plurality of elements from a technology library, wherein the cell characteristics comprise the respective gate leakage estimate for that element as a function of the logic states at the inputs to that element.

15. The method of claim 14 wherein the cell characteristics for each of the plurality of elements further comprise a look-up table having, for each combination of the logic states at the inputs to the element, a corresponding gate leakage estimate for that element.

16. The method of claim 15 wherein the cell characteristics for each of the plurality of elements further comprise a look-up table having, for each combination of the logic states at the inputs to the element, a corresponding channel leakage estimate for the element.

17. The method of claim 12 and further comprising:

(c) measuring actual gate leakage of an integrated circuit which is fabricated according to the integrated circuit design and is operated in the operating state simulated in (a); and (d) identifying whether a potential defect exists in the integrated circuit based on the actual gate leakage measured in (c) and the total gate leakage estimate produced in (b).

18. An integrated circuit technology library comprising a cell library definition for each of a plurality of elements in the library, wherein each cell library definition comprises:

a list of inputs to the element;

a list of each transistor in the element;

a gate area for each of the transistors in the element;

a gate leakage per unit area for each of the transistors in the element; and a gate leakage estimate for each combination of logic states at the inputs to the element, which is based on the gate area and the gate leakage per unit area of each of the transistors in the element that are in an ON state for that combination of logic states.

* * * * *